United States Patent [19]

Teuho

[11] Patent Number: 5,211,765
[45] Date of Patent: May 18, 1993

[54] METHOD FOR IMPROVING THE SPRINGBACK QUALITIES OF SUPERCONDUCTORS

[75] Inventor: Juhani Teuho, Pori, Finland
[73] Assignee: Outokumpu Oy, Espoo, Finland
[21] Appl. No.: 738,956
[22] Filed: Aug. 1, 1991
[51] Int. Cl.$^5$ .............................................. H01B 12/00
[52] U.S. Cl. ........................................ 148/96; 29/599; 148/98
[58] Field of Search ...................... 148/12.7 B, 11.5 F, 148/930, 11.5 C, 96, 98; 29/599

[56] References Cited

U.S. PATENT DOCUMENTS

| | | | |
|---|---|---|---|
| 3,571,922 | 3/1971 | Schweitzer | 29/599 |
| 3,697,335 | 10/1972 | Kyriakis et al. | 148/154 |
| 3,953,922 | 5/1976 | Heim | 148/133 |
| 4,178,676 | 12/1979 | Dustmann et al. | 29/599 |
| 4,327,244 | 4/1982 | Horvath et al. | 29/599 |
| 4,983,228 | 1/1991 | Taub et al. | 148/11.5 F |

OTHER PUBLICATIONS

Metals Handbook Ninth Edition, vol. 2, (American Society for Metals Handbook Committee), pp. 252-255.

*Primary Examiner*—Upendra Roy
*Attorney, Agent, or Firm*—McAulay Fisher Nissen Goldberg & Kiel

[57] ABSTRACT

The invention relates to a method for improving the springback qualities of superconductors. According to the method, a superconducting wire is in the final stage of production cold worked with a minimal reduction, in which case the springback qualities are improved but the residual resistivity ratio RRR still remains sufficiently high.

11 Claims, No Drawings

METHOD FOR IMPROVING THE SPRINGBACK QUALITIES OF SUPERCONDUCTORS

BACKGROUND OF THE INVENTION

1. Field of the Invention

The present invention relates to a method for improving the springback qualities of superconductors. According to the method, in the final stage of production a superconducting wire is cold worked by employing an extremely small reduction, in which case the springback qualities are improved, but the residual resistivity ratio, RRR, still remains sufficiently high.

2. Description of Related Art

In the cabling of Cu/NbTi superconducting wires, springback has become an essential quality, because extremely high requirements are set for the homogeneity of magnetic fields. The term 'springback' means the springlike return that takes place in the wire, when it is, after bending, released from the influence of external power. For instance, in the testing instructions of SSC (Superconducting Super Collider), wires there is defined a method for determining the springback qualities of superconductors. In the test, the wire is wound ten times around a bar with a diameter of 9.5 mm, while the tension for the whole duration of the winding is 2 kg. The tension is removed, and the return measured by degrees.

In a cable (for instance of the Rutherford type) which is cabled of a wire with weak springback qualities, the individual wires can rise up from the planar surface of the cable, thus causing changes in dimension. The relatively strong return tendency of bent superconducting wire is due to the springlike property of the superconductor in the final annealed state. The copper serving as the matrix material is normally soft annealed in order to achieve a good RRR value, and soft copper cannot resist the return tendency of NbTi filaments.

It has been attempted to change the springlike return effect by changing the cross-section of the wire by placing the filament area as centrally as possible. This is, however, only possible with such conductors that contain an extremely small amount of some superconducting material. Even then, however, the shifting over to an area with the risk of central bursting in the drawing may easily take place. This restricts the achieved lengths.

When employing a normal production route, the superconductor is in the end annealed in order to make the matrix copper soft, so that a high RRR value is secured at the same time. In some cases (for instance when using large Cu/Sc ratios) there are needed conductors with a higher strength value than the soft copper matrix can produce. In this case the wire is 7-9% overdrawn. The strength increases, but the RRR is decreased nearly down to its minimum. The 7-9% overdrawing is carried out exactly for improving strength, and it is a normal method for this purpose.

SUMMARY OF THE INVENTION

According to the present invention it is found out that the springback caused by the NbTi filaments can be essentially reduced by cold working the surface of the superconducting wire by using a minimal reduction. Thus the worked surface layer can, particularly better than before, reduce the springback caused by the NbTi filaments. At the same time, the RRR value of the wire still remains on a sufficiently high level. The essential novel features of the invention are apparent from the appended patent claims.

DESCRIPTION OF THE PREFERRED EMBODIMENT

According to the invention, in the initial stages the production of superconducting wire is carried out as before. In the end of the production chain, the wire is drawn, after twisting, nearly to its final dimension or as far as its final dimension, there is carried out annealing for softening the matrix copper, and in the last stage the wire is overdrawn according to the invention. The reduction of the overdrawing is, even in its minimum value, only as much as the elasticity of the superconducting wire, and in its maximum value 3% at the most, advantageously below 1.5%. The reduction is dependent on the desired final product. The RRR value, as well as the springback value, can, when necessary, be improved by using two soft annealings, with a 10-15% working in between, in which case the chain of production proceeds in the following order: twisting - annealing - drawing - annealing - overdrawing.

By employing the method of the present invention, the springback value of superconducting wire has been essentially reduced by subjecting the wire to a controlled 0-3% cold working after then annealing of matrix copper. Owing to the effect of the working, the RRR value of the wire is weakened, but it still remains on a sufficiently high level with respect to most applications. The table below describes results that were achieved by the method of the invention, with a SCOK 3700 wire, the diameter whereof is 0.648 mm. The SCOK 3700 wire was particularly designed for RHIC/-dipole and quadrupole magnets.

TABLE 1

The effect of the overdrawing to the springback/RRR values SCOK 3700

| Reduction | Springback | RRR | Cu/Sc |
|---|---|---|---|
| 0 | 1260° | 140 | 2.20 ± 0.05 |
| 1.22% | 828–846° | 72 | 2.20 ± 0.05 |
| <1% | 1035° | 78 | " |
| <1% | 1070–1080° | 84 | " |
| <1% | 900–920° | 93–97 | " |
| <1% | 900–920° | 93–98 | " |

The first reading in the table represents a reference value, in which case the overdrawing has not been performed. In the three following experiments, there was carried out one soft annealing of copper, but in the two last experiments there were carried out two soft annealings.

For this purpose, it should be noted that a soft annealing of the copper is carried out in two stages, and in between the first and the second annealings, a 10 to 15% working is performed, and after the second annealing an overdrawing is performed in the form of a cold working up to 3%.

I claim:

1. A method for improving springback qualities of solely a Cu/NbTi superconducting composite wire consisting of NbTi filaments and copper matrix material and simultaneously maintaining the residual resistivity ratio (RRR) comprising the steps of:
   soft annealing matrix copper; and
   subjecting the composite wire to a cold working reduction with a reduction corresponding to the elastic limit of the superconducting composite wire.

2. The method of claim 1, wherein during the cold working step the composite wire is subjected to an overdrawing for a carrying out the cold working.

3. The method of claim 1, including carrying out the soft annealing of the matrix copper in two stages, comprising:
   a first annealing, and then a drawing; and
   a second annealing and an overdrawing.

4. The method of claim 1, wherein the soft annealing of matrix copper is carried out in two stages, so that in between the annealings there is performed a 10-15% working, and after the second annealing there is performed the cold working reduction up to 3%.

5. The method of claim 1, wherein the cold working is an overdrawing.

6. The method of claim 2, wherein the reduction of the cold working reduction is no more than 3% at the most.

7. The method of claim 2, wherein the reduction due to the overdrawing remains between the elastic limit of the superconducting wire and 1.5%.

8. The method of claim 3, including performing a 10 to 15% working after said full annealing.

9. The method of claim 3, wherein the overdrawing includes subjecting the composite wire to a controlled cold working up to 3% after the second annealing of the matrix copper.

10. The method of claim 3, wherein the reduction due to the overdrawing remains between the elastic limit of the superconducting wire and 1.5%.

11. A method for improving springback qualities of a Cu/NbTi superconducting wire and simultaneously maintaining the residual resistivity ratio (RRR), comprising the steps of:
   soft annealing matrix copper;
   subjecting the composite wire to a cold working reduction with a reduction corresponding to the elastic limit of the superconducting wire; and
   the composite wire being subjected to an overdrawing for carrying out the cold working up to 3%.

* * * * *